(12) United States Patent
Chua et al.

(10) Patent No.: US 7,456,032 B2
(45) Date of Patent: Nov. 25, 2008

(54) METHOD AND SYSTEM FOR MEASURING LASER INDUCED PHENOMENA CHANGES IN A SEMICONDUCTOR DEVICE

(75) Inventors: Choon Meng Chua, Singapore (SG); Lian Ser Koh, Singapore (SG); Hoo Yin Ng, Singapore (SG); Jacob Chee Hong Phang, Singapore (SG); Soon Huat Tan, Singapore (SG)

(73) Assignee: Semicaps PTE Ltd., Singapore (SG)

( * ) Notice: Subject to any disclaimer, the term of this patent is extended or adjusted under 35 U.S.C. 154(b) by 466 days.

(21) Appl. No.: 11/158,945

(22) Filed: Jun. 21, 2005

(65) Prior Publication Data

US 2006/0284625 A1 Dec. 21, 2006

(51) Int. Cl.
*G01R 31/26* (2006.01)

(52) U.S. Cl. .................. 438/17; 438/798; 257/E21.531

(58) Field of Classification Search .......... 257/E21.524, 257/E21.529, E21.531
See application file for complete search history.

(56) References Cited

U.S. PATENT DOCUMENTS

| 4,578,641 A * | 3/1986 | Tiedje ...................... 324/767 |
| 6,369,603 B1 * | 4/2002 | Johnston et al. ............. 324/766 |

* cited by examiner

*Primary Examiner*—Stephen W Smoot
(74) *Attorney, Agent, or Firm*—Townsend and Townsend and Crew, LLP (57) ABSTRACT

A method and system for measuring laser induced phenomena changes of at least one of a resistance, a capacitance and an inductance in a semiconductor device. The method comprises interconnecting an electrical bridge circuit across the semiconductor device, the semiconductor device being connected as one of at least four circuit elements of the bridge circuit; inducing the changes in the semiconductor; and monitoring a balance condition of the bridge circuit.

12 Claims, 9 Drawing Sheets

METHOD AND SYSTEM FOR MEASURING LASER INDUCED PHENOMENA CHANGES IN A SEMICONDUCTOR DEVICE

FIELD OF INVENTION

The present invention relates broadly to a method and system for measuring laser induced phenomena changes of at least one of a resistance, a capacitance and an inductance in a semiconductor device.

BACKGROUND

Laser induced phenomena on semiconductor devices are used for example for failure analysis techniques for a variety of semiconductor devices. Examples of such failure analysis techniques include light- and charge-induced voltage alteration (LIVA and CIVA) techniques, thermally-induced voltage alteration (TIVA) techniques, optical beam induced current (OBIC) techniques, and optical beam induced resistance change (OBIRCH) techniques.

Existing systems for implementing the above mentioned techniques have each been applied to failure analysis for particular purposes and conditions. However, existing systems do have certain limitations and disadvantages, which have hindered any one system from being suitable for a wide variety of analysis purposes and conditions.

For example, while existing systems for TIVA and LIVA techniques are not complex to implement, such systems do require a constant current biasing and an AC coupled amplifier. Constant current biasing interferes with the equilibrium state of the device under test (DUT). Furthermore, as voltage fluctuations occur during power-up of active DUTs, current TIVA and LIVA systems are typically limited to being applied to passive DUTs.

As another example, existing OBIRCH systems, which are based on measuring changes in a current flow through the DUT, have been found to provide a lower sensitivity in the failure analysis compared to LIVA systems, for example.

A need therefore exists for an alternative monitoring and measurement system and method for laser induced phenomena applications on semiconductor devices, which may address one or more of the above mentioned limitations and disadvantages.

SUMMARY

In accordance with a first aspect of the present invention there is provided a method of measuring laser induced phenomena changes of at least one of a resistance, a capacitance and an inductance in a semiconductor device, the method comprising interconnecting an electrical bridge circuit across the semiconductor device, the semiconductor device being connected as one of at least four circuit elements of the bridge circuit; inducing the changes in the semiconductor device; and monitoring a balance condition of the bridge circuit.

The bridge circuit may be initially balanced prior to inducing the changes in the semiconductor device.

The other circuit elements of the bridge circuit may each comprise a switch matrix of interconnected components, and the method further comprises setting the other circuit elements to at least one of a selected resistance value, a selected capacitance value, and a selected inductance value.

The method may comprise setting the circuit elements to the selected values incrementally.

The other circuit elements may each comprise a relay block.

The selected values may be substantially equal to corresponding values measured across the semiconductor device without the laser induced phenomena.

The corresponding values may be measured with the bridge circuit in a state wherein the one or more circuit elements connected in series with the semiconductor device are switched to short circuit, and the other circuit elements are switched to open circuit.

The voltage applied across the bridge circuit may be selected such that an operating voltage of the semiconductor device is applied to the semiconductor device.

The monitoring of the balance condition of the bridge circuit may comprise an A/D conversion.

The method may further comprise moving a laser beam across a surface of the semiconductor device.

The monitoring of the balancing condition of the bridge circuit may be coupled to the moving of the laser beam for generating a map of the laser induced changes with reference to the surface of the semiconductor device.

The method may further comprise utilising a pulsed laser beam for inducing the changes.

In accordance with a second aspect of the present invention there is provided a system for measuring laser induced phenomena changes of at least one of a resistance, a capacitance and an inductance in a semiconductor device; the system comprising an electrical bridge circuit for interconnection across the semiconductor device, the semiconductor device being connected as one of at least four circuit elements of the bridge circuit, the bridge circuit including a null detector for monitoring a balance condition of the bridge circuit and an electrical source for applying a voltage across the bridge circuit; and a laser source for inducing the changes in the semiconductor device.

The other circuit elements of the bridge circuit may each comprise a relay block of interconnected components, and the system further comprises a controller for setting the relay blocks to at least one of a selected resistance value, a selected capacitance value, and a selected inductance value.

The controller may set the relay blocks to the selected values incrementally.

The selected values may be substantially equal to corresponding values measured across the semiconductor device without the laser induced phenomena.

The system may further comprise a source measurement unit for measuring the corresponding values.

The source measurement unit may be arranged for connection across the semiconductor device with the bridge circuit in a state wherein the one or more circuit elements connected in series with the semiconductor device are switched to short circuit, and the other circuit elements are switched to open circuit.

The voltage applied across the bridge circuit may be selected such that an operating voltage of the semiconductor device is applied to the semiconductor device.

The system may further comprise a monitoring unit for monitoring an output from the null detector for monitoring the laser induced changes in the semiconductor device.

The monitoring unit may comprise an A/D converter.

The system may further comprise a raster unit for moving a laser beam originating from the laser source across a surface of the semiconductor device.

The monitoring unit may be coupled to the raster unit for generating a map of the laser induced changes with reference to the surface of the semiconductor device.

The null detector may comprise an amplifier.

The system may further comprise an optical modulator for creating a pulsed laser beam.

The bridge circuit comprises a DC bridge or an AC bridge.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
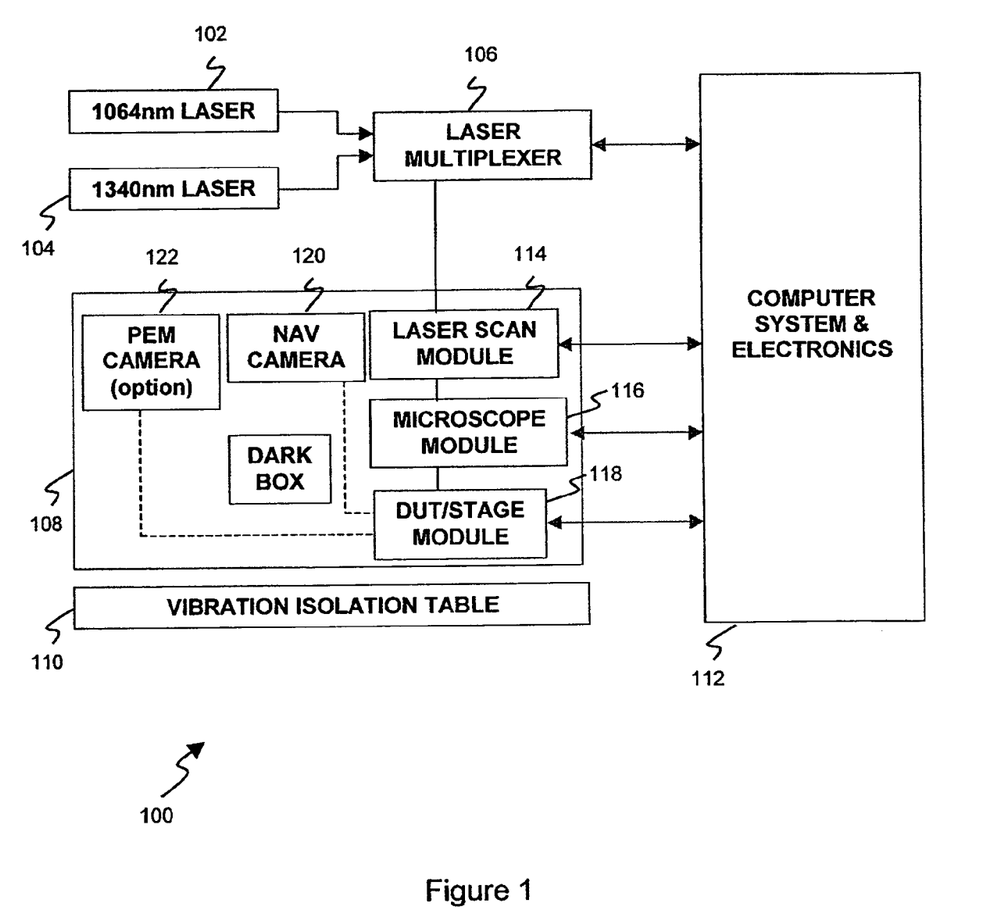
FIG. 1 shows a schematic diagram illustrating a monitoring and measurement system according to an example embodiment of the present invention.

FIG. 1 shows a schematic diagram illustrating a monitoring and measurement system 100 according to an example embodiment of the present invention. The system 100 comprises two laser sources, a 1064 nm laser source 102 and a 1340 nm laser source 104, coupled to a laser multiplexer 106.

Various monitoring and measurement components, generally indicated at 108, are provided on a vibration isolation table 110, and coupled to a computer system and electronics module 112. The computer system and electronics module 112 are coupled to the laser multiplexer 106, which in turn is optically coupled to a laser scan module 114 mounted on the vibration isolation table 110. A microscope module 116 is provided and optically coupled between the laser scan module 114 and a stage module 118, on which a DUT (not shown) is mounted during monitoring and measurement. The computer system and electronics module 112 are further coupled to the microscope module 116, and the stage module 118.

A TV-rate black/white charge-coupled device (CCD) camera 120 and a positron emission mammography (PEM) camera 122 are mounted on the vibration isolation table 110 in the example embodiment. The CCD camera 120 and PEM camera 122 are arranged to be optically coupled to the DUT stage module 118 for capturing NAV and PEM images, respectively.

Figure 2:
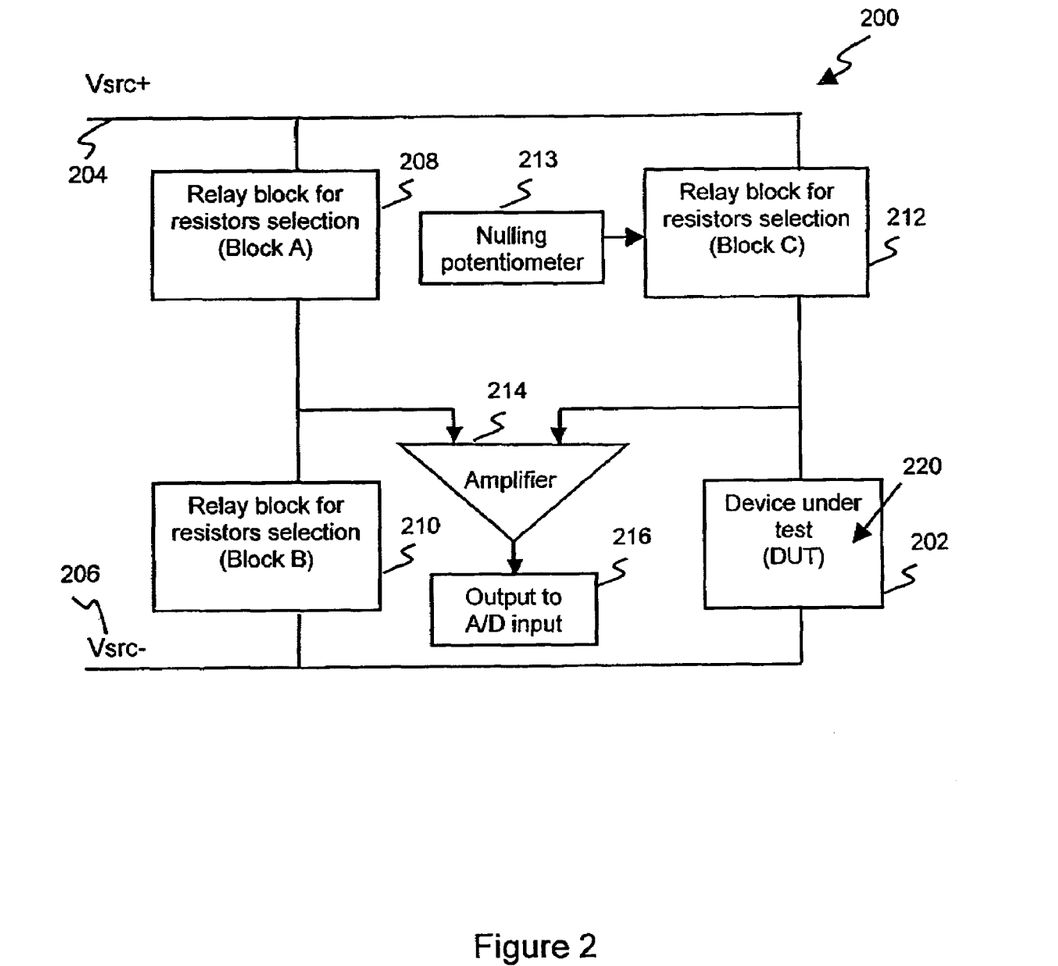
FIG. 2 shows a schematic circuit diagram of a monitoring and measurement circuit according to the example embodiment.

FIG. 2 shows a schematic circuit diagram of a monitoring and measurement circuit 200 as implemented in the monitoring and measurement system 100 (FIG. 1), in the example embodiment. The circuit 200 is utilised to measure the resistance of a semiconductor DUT 202 through the $V_{SRC+}$ and $V_{SRC-}$ inputs 204, 206. The DUT 202 may e.g. be a test structure or an actual very large scale integration (VLSI) device. In the example embodiment, the measurement of the resistance of the DUT 202 is performed using the Wheatstone bridge-type circuit 200 comprising three relay blocks 208, 210, 212 for resistor selection, the DUT 202, a nulling potentiometer 213 coupled to the relay block 212, and an amplifier 214.

For performing the monitoring and measurement of resistance changes in the DUT 202 in the example embodiment, open circuit is initially selected for relay blocks 208 and 210, and short circuit is selected for relay block 212. The resistance of the DUT 202 is measured using an external source measurement unit (not shown) connected to the inputs 204, 206. The voltage provided by the source measurement unit is the operating voltage of the DUT 202, for measuring the resistance at the biasing point of interest in the example embodiment. The DUT 202 is connected in the circuit 200 utilising the DUTs 202 power supply connections. Subsequently, the external source measurement unit is disconnected, and relay blocks 208, 210 and 212 are switched to the same measured resistance as the DUT 202.

To conduct monitoring and measurement of the resistance alterations in the DUT 202 according to the example embodiment, a voltage set to twice the required voltage by the DUT 202 is supplied to the inputs 204, 206, thus providing the operating voltage required to the DUT 202. The nulling potentiometer 213 in the Wheatstone bridge-type circuit 200 coupled to the relay block 212 is then used to null the amplifier 214. The output 216 of the amplifier 214 is connected to an analog to digital (A/D) input of a controller circuit (not shown) for monitoring the nulling and subsequently recording of resistance changes across the DUT 202 based on the measured output voltage changes of amplifier 214.

During testing, a laser beam 220 for thermal simulation is rastered across the surface of the DUT 202 and changes in the resistance across the DUT 202 are induced due to temperature changes as a result of the thermal stimulation. The scanning of the laser 220 is controlled by the computer system and electronics module 112 (FIG. 1), and a map of the resistance change across the DUT 202 can be obtained based on the measured output voltage of the amplifier 214.

As will be appreciated by a person skilled in the art, while the laser beam 220 is rastered across the surface of the DUT 202, the generated heat is dissipated from the point of incidence of the laser beam 220 on the DUT 202. The heat dissipation is affected by a number of parameters or properties of the DUT 202, including e.g. the presence of defects such as voids. Therefore, the resulting temperature increases at different points of incidence of the laser beam 220 produces different changes in the resistance across the DUT 202. The resulting map of the resistance changes as a function of the position of the point of incidence of the laser beam 220 on the DUT 202 can be used to e.g. obtain a map indicative of location of defects such as voids in the DUT 202.

By using the Wheatstone bridge-type circuit 200 to measure the resulting resistance changes, the example embodiment offers constant voltage biasing for normal operation of the DUT 202, and the detection of voltage changes using DC nulling. Therefore, unlike existing systems, which utilise constant current biasing, such as existing TIVA systems, the example embodiment may be equally applied to active and passive devices. Furthermore, because a voltage nulling based technique is utilised in the example embodiment, a higher sensitivity may typically be achievable compared to e.g. existing systems based on current measurements across the DUT such as in existing OBIRCH systems.

In the example embodiment described above with reference to FIG. 2, a Wheatstone bridge-type circuit is used, however, it will be appreciated that other circuits for the measurement of the resistance changes utilising nulling techniques may be used in different embodiments, including, but not limited to, Shering bridge-, Kelvin bridge-, Hay bridge-, resistance- ratio bridge-, and Maxwell bridge-type circuits.

Furthermore, while in the embodiment described above with reference to FIG. 2 the resistance changes are described as being thermally induced, it will be appreciated by the person skilled in the art that embodiments of the present invention are equally suitable for monitoring and measuring resistance changes in a DUT as a result of different laser-induced phenomena, including, but not limited to, electron-hole pair stimulation. Furthermore, it will be appreciated by the person skilled in the art that embodiments of the present invention are equally suitable for ion- and electron-beam stimulation monitoring and measuring.

Returning now to FIG. 2, in the implementation of the example embodiment, the relay blocks 208, 210 and 212 are incrementally increased after the power-up with the voltage set to twice the required voltage by the DUT 202. This can minimise or reduce unwanted in-rush currents in the circuit 200 and thus the DUT 202. In the example embodiment, each relay block 208, 210 and 212 is implemented as four (2×4) relay blocks connected in series. Circuit diagrams for the respective (2×4) relay blocks of the relay block 208 are shown in FIGS. 3 to 6 respectively. It will be appreciated by the person skilled in the art that relay blocks 210 and 212 are implemented using corresponding circuits in the example embodiments.

Figure 3:
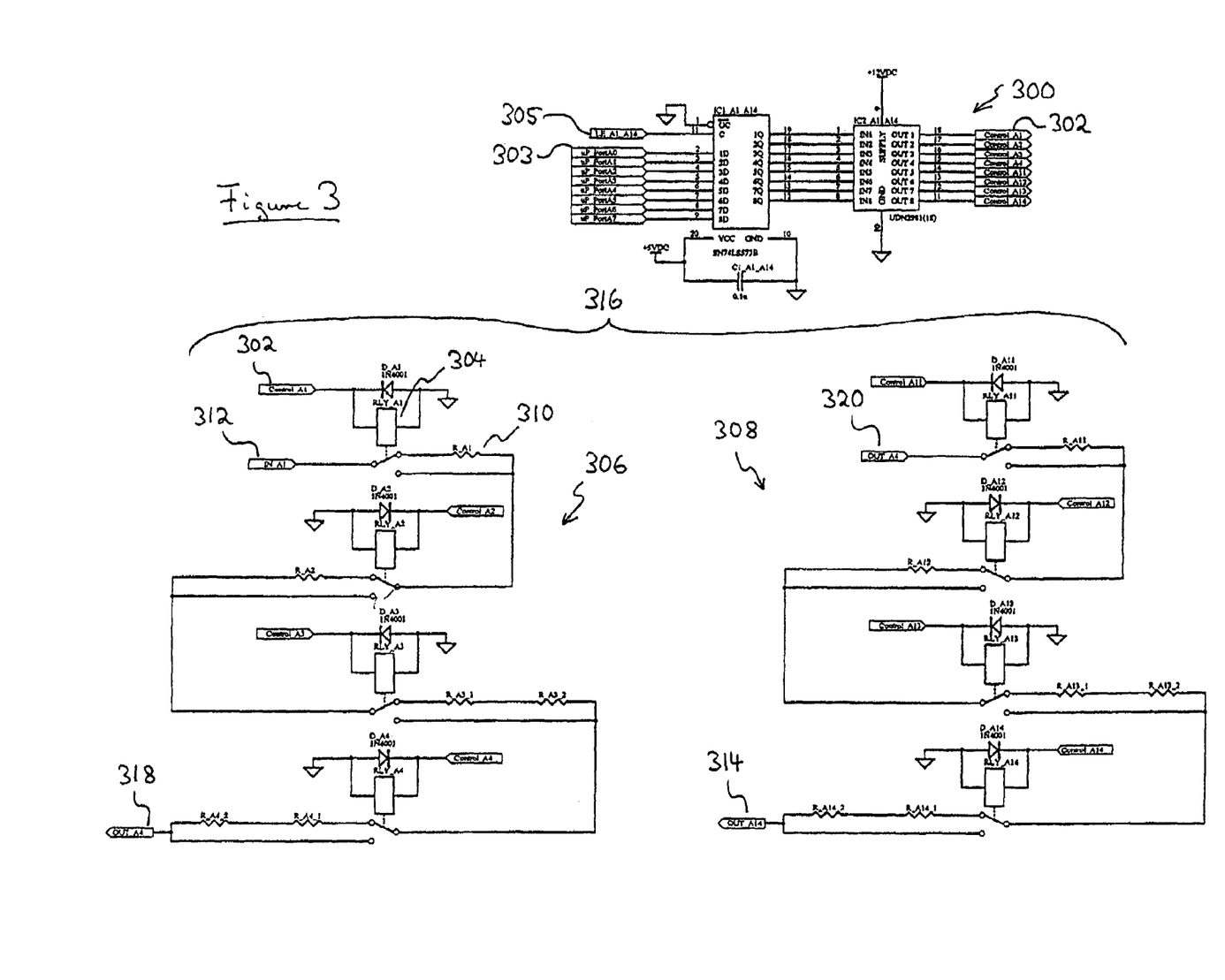
FIG. 3 shows a circuit diagram of a detail of the a monitoring and measurement circuit according to the example embodiment.

In FIG. 3, a latch circuit 300 provides control signals e.g. 302 to relays e.g. 304 of the (2×4) relay blocks 306, 308. As will be appreciated by the person skilled in the art, the relays, e.g. 304, are used to switch resistors, e.g. 310, in or out of a series connection between the input, e.g. 312, and output, e.g. 314, of the (2×4) relay blocks e.g. 306. The output 314 of the one relay block 306 is connected to the input 320 of the other relay block 308, continuing the series connection.

Figure 4:
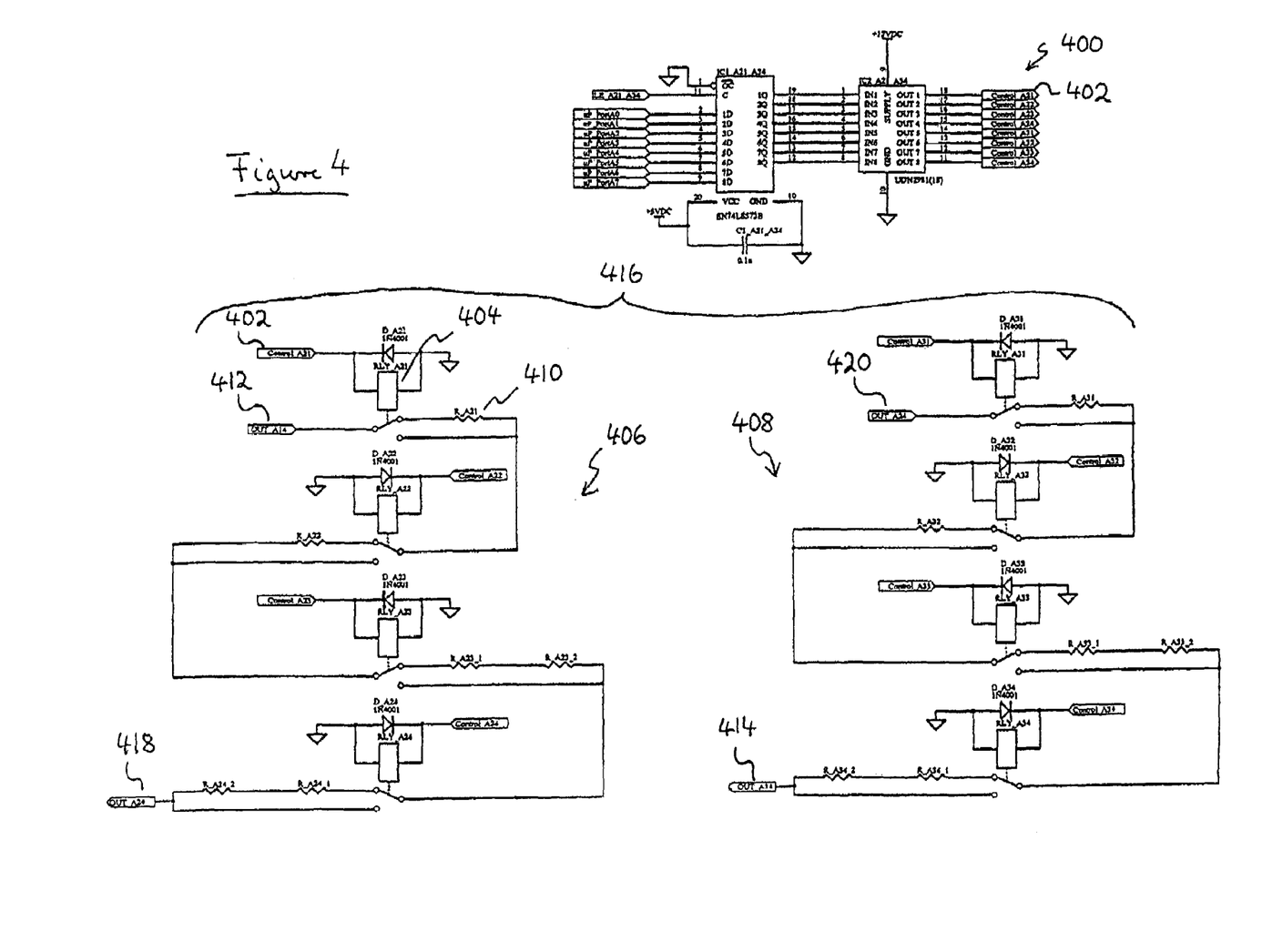
FIG. 4 shows a circuit diagram of a detail of the a monitoring and measurement circuit according to the example embodiment.

Similarly, in FIG. 4, a latch circuit 400 provides control signals e.g. 402 to relays e.g. 404 of the (2×4) relay blocks 406, 408. As will be appreciated by the person skilled in the art, the relays, e.g. 404, are used to switch resistors, e.g. 410, in or out of a series connection between the input, e.g. 412, and output, e.g. 414, of the (2×4) relay blocks, e.g. 406. The output 414 of the one relay block 406 is connected to the input 420 of the other relay block 408, continuing the series connection.

Figure 5:
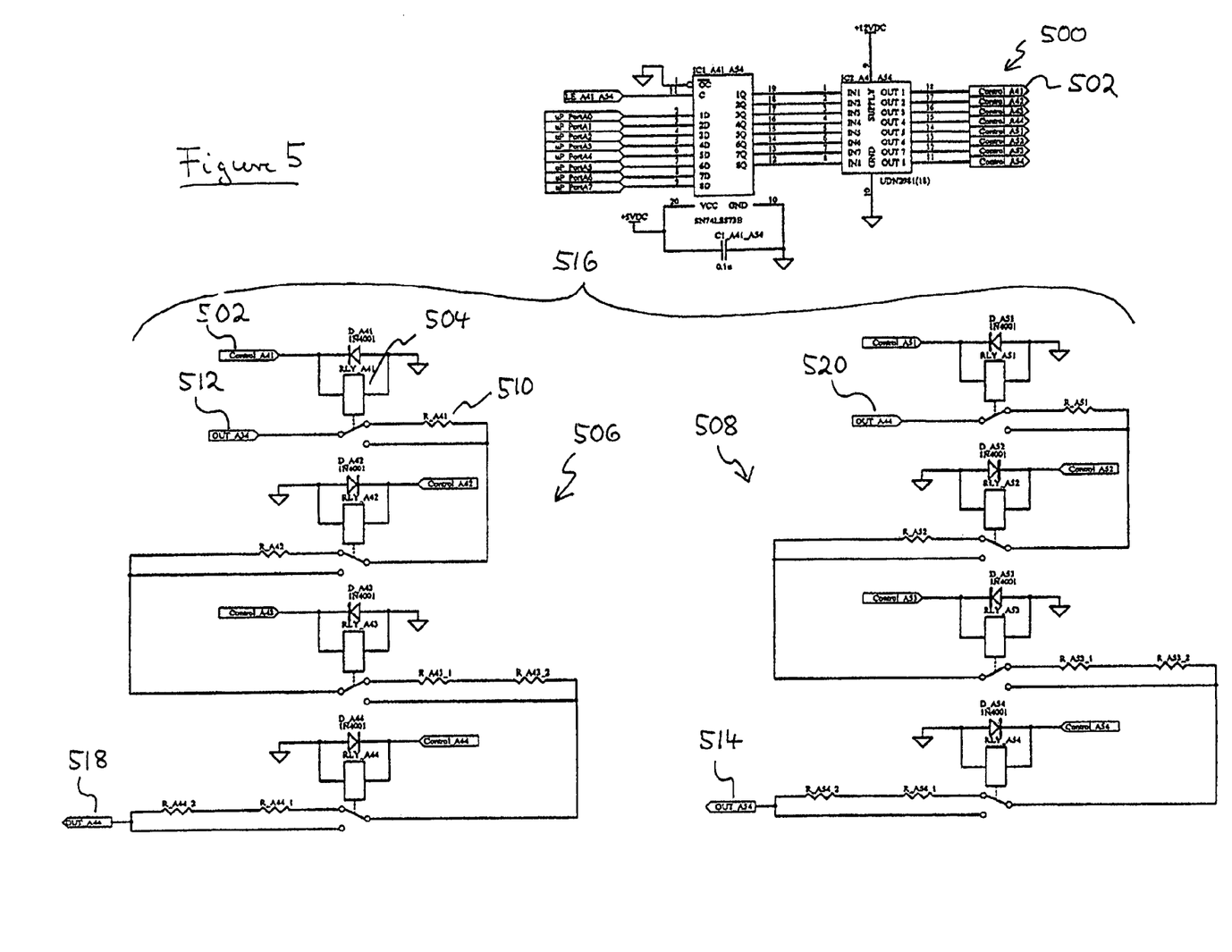
FIG. 5 shows a circuit diagram of a detail of the a monitoring and measurement circuit according to the example embodiment.

Similarly, in FIG. 5, a latch circuit 500 provides control signals e.g. 502 to relays e.g. 504 of the (2×4) relay blocks 506, 508. As will be appreciated by the person skilled in the art, the relays, e.g. 504, are used to switch resistors, e.g. 510, in or out of a series connection between the input, e.g. 512, and output, e.g. 514, of the (2×4) relay blocks e.g. 506. The output 514 of the one relay block 506 is connected to the input 520 of the other relay block 508, continuing the series connection.

Figure 6:
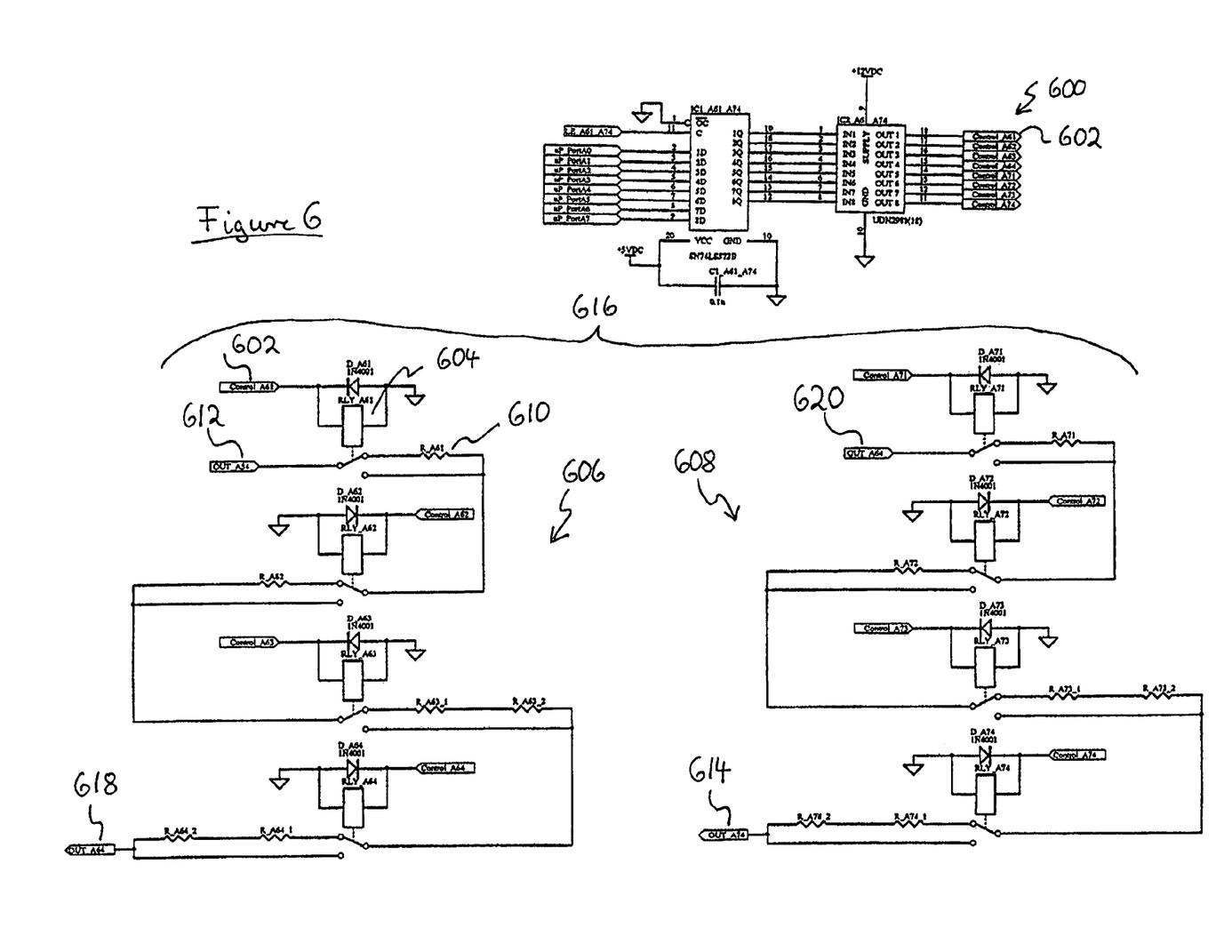
FIG. 6 shows a circuit diagram of a detail of the a monitoring and measurement circuit according to the example embodiment.

Similarly, in FIG. 6, a latch circuit 600 provides control signals e.g. 602 to relays e.g. 604 of the (2×4) relay blocks 606, 608. As will be appreciated by the person skilled in the art, the relays, e.g. 604, are used to switch resistors, e.g. 610, in or out of a series connection between the input, e.g. 612, and output, e.g. 614, of the (2×4) relay blocks e.g. 606. The output 614 of the one relay block 606 is connected to the input 620 of the other relay block 608, continuing the series connection.

To complete the relay block 208 (FIG. 2), the output 322 (FIG. 3) is connected to the input 412 (FIG. 4), the output 422 (FIG. 4) is connected to the input 512 (FIG. 5), and the output 522 (FIG. 5) is connected to the input 612 (FIG. 6).

Figure 7:
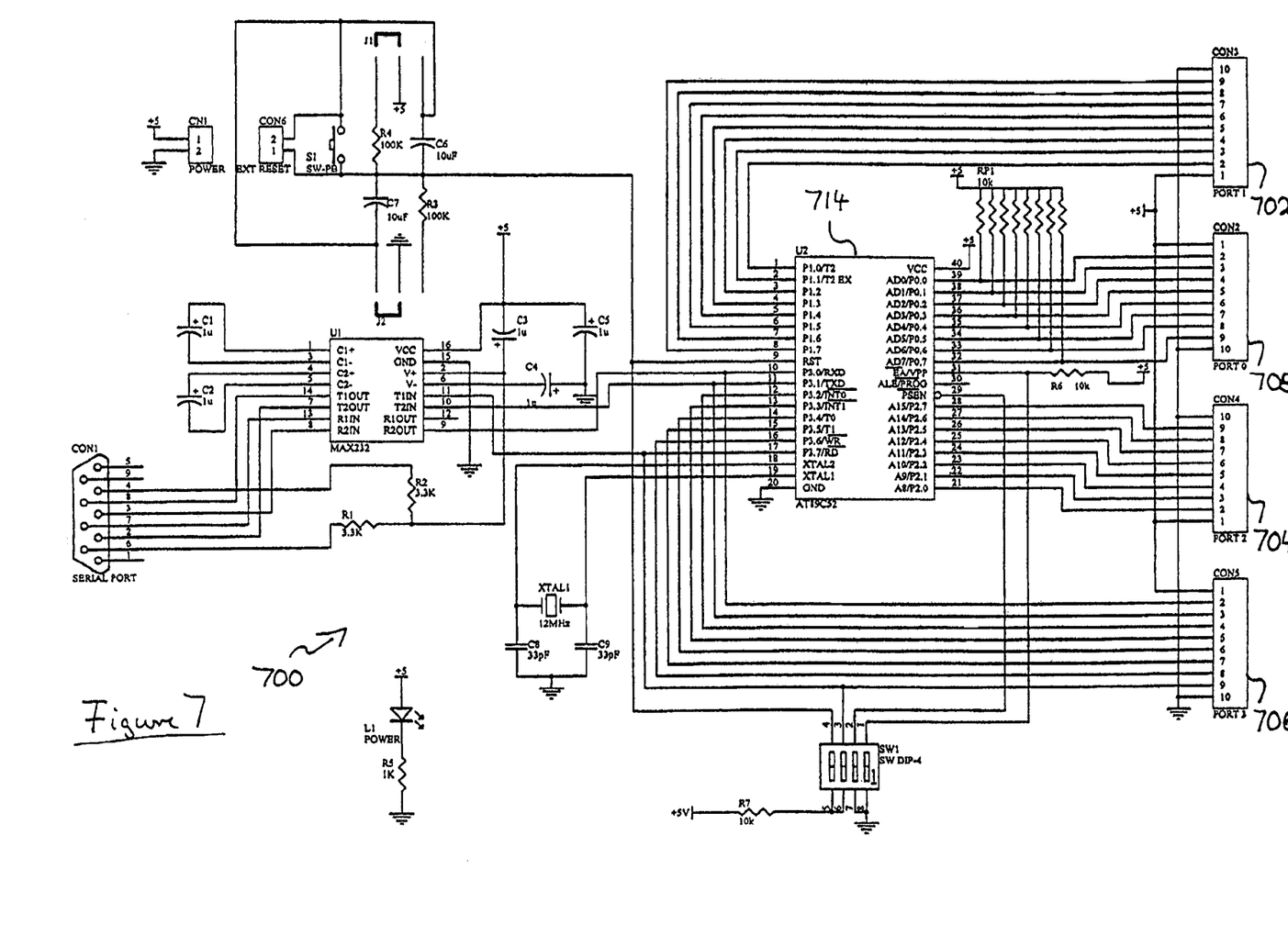
FIG. 7 shows a circuit diagram of a detail of the a monitoring and measurement circuit according to the example embodiment.

FIG. 7 shows a circuit diagram of the micro controller board used in the implementation of the example embodiment for the control of the Wheatstone bridge-type circuit (compare 200 in FIG. 2).

On the micro controller board circuit 700, interconnections to the respective latch circuits e.g. 300 (FIG. 3) and the individual (2×4) relay blocks e.g. 316 (FIG. 3) are provided through ports 702, 708 and 704. In particular, eight common signals to the respective latch circuits e.g. 300 (FIG. 3) are provided through port 702, for provision of control signals e.g. 303 (FIG. 3).

On port 708, four signal lines are provided for relay block 208 (FIG. 2), in particular one signal e.g. 305 (FIG. 3) for each latch circuit e.g. 300 (FIG. 3) of the four respective (2×4) relay blocks. Similarly, four signals to the respective latch circuits associated with relay block 210 (FIG. 2) are also provided through port 708, while four signals to the respective latch circuits of relay blocks 212 (FIG. 2) are provided through port 704. The remaining signal lines of port 704 are not used in the example embodiment.

The micro controller board circuit 700 is further coupled to a Personal Computer (PC) component of the computer system and electronics module 112 (FIG. 1) through port 706.

The example embodiment described above with reference to FIGS. 2 to 7 is implemented for DC resistance changes of a DUT. However, in other embodiments of the present invention, changes in the impedance, i.e. capacitance, inductance, and resistance due to laser induced phenomena in a DUT can be measured and monitored. As will be appreciated by the person skilled in the art, impedance bridge circuits operate in the same way as resistance bridge circuits described above with reference to FIGS. 2 to 7, the only difference being that the balance equation is with respect to complex quantities, as both magnitude and phase across the components of the bridge must be equal in order for nulling to occur. As a result, the null detector in such embodiments comprises a device capable of detecting AC voltages.

Figure 8:
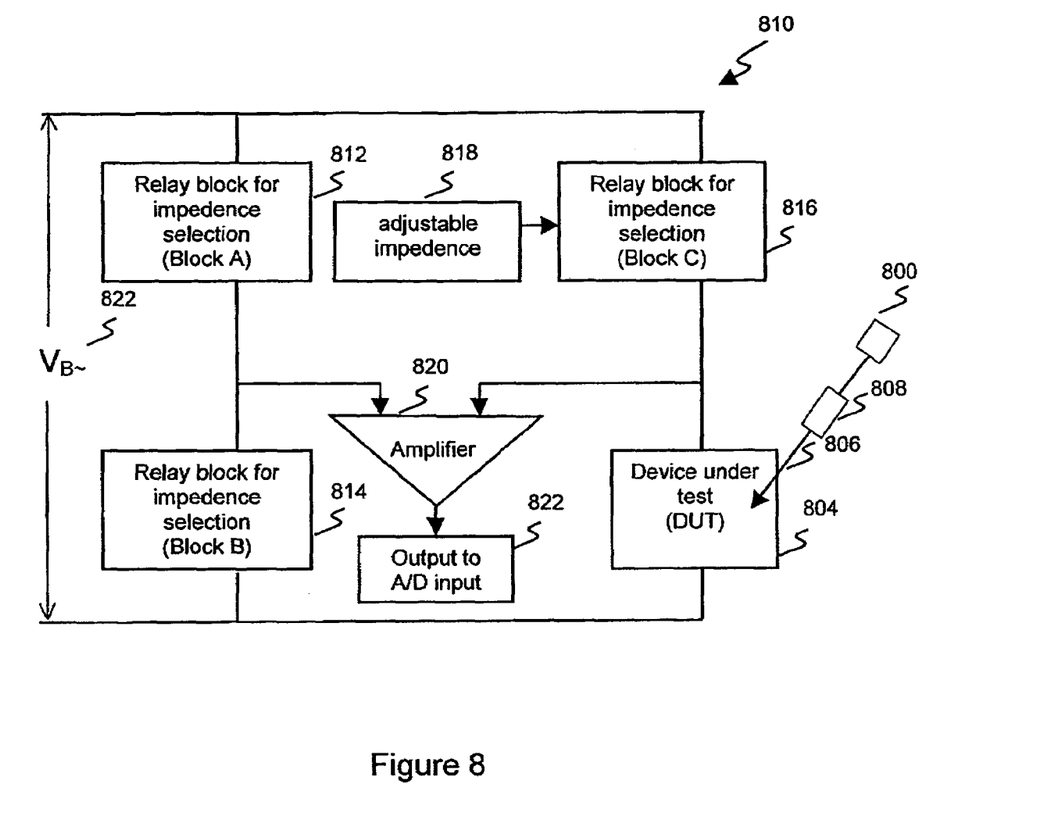
FIG. 8 shows a schematic diagram illustrating a monitoring and measurement system according to another example embodiment of the present invention.

In one such example embodiment illustrated in FIG. 8, an infrared helium neon (HeNe) laser 800 with a wavelength of about 1152 nm and about 1 mW power may be used to generate electron-hole pairs in a metal on silicon (MOS) DUT 804. The laser beam 806 may be pulsed by modulation using an acousto-optic modulator (AOM) 808 coupled to the laser beam 806. The depth of modulation is determined by the amplitude of the modulating input into the AOM 808, and by alternating the modulation between 0% and 100% the laser beam 806 can be pulsed.

In this embodiment, an AC Wheatstone bridge-type circuit 810 comprising three relay blocks 812, 814, 816 for impedence selection, the DUT 804, a nulling adjustable impedence 818 coupled to relay block 816, and an AC amplifier 820 for differential impedance monitoring and measurement. The output 822 of the amplifier 820 is connected to an AC-capable analog to digital (A/D) input of a controller circuit (not shown) for monitoring the nulling and subsequently recording of impedance changes across the DUT 804 based on the measured output voltage changes of amplifier 820. An AC biasing signal 822 is applied in this example embodiment.

The use of a pulsed laser beam in this example embodiment can facilitate increased sensitivity measurements as lower frequency noise during the measurement can be filtered out. It will be appreciated by the person skilled in the art that a pulsed laser source may equally be employed in a DC bridge embodiment of the present invention, and similarly, a non-pulsed laser source may be employed in an AC bridge embodiment.

Figure 9:
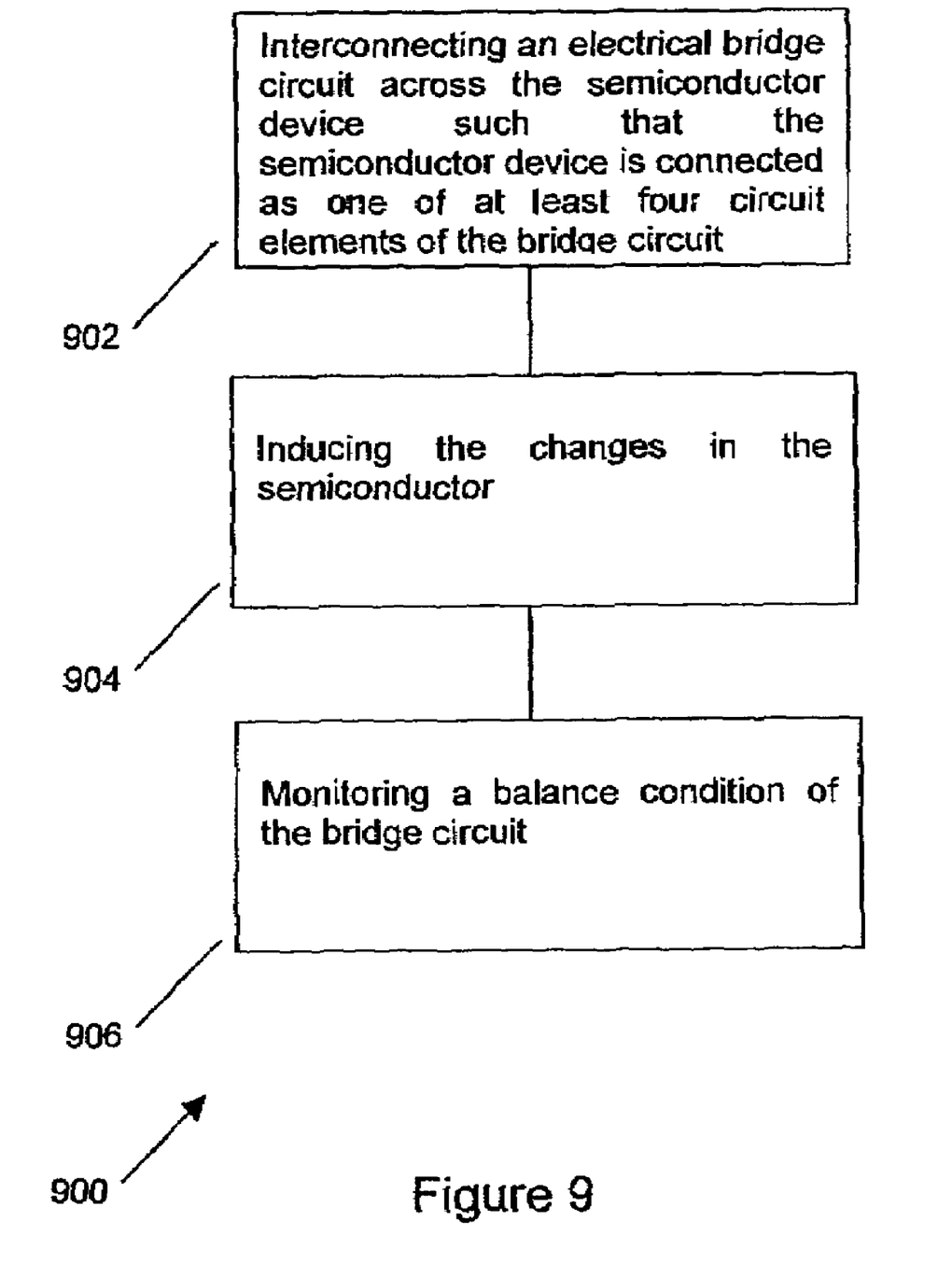
FIG. 9 shows a flowchart illustrating a method of measuring laser induced phenomena changes of at least one of a resistance, a capacitance and an inductance in a semiconductor device, according to an example embodiment

FIG. 9 shows a flowchart illustrating a method 900 of measuring laser induced phenomena changes of at least one of a resistance, a capacitance and an inductance in a semiconductor device, according to an example embodiment. At step 902, an electrical bridge circuit is interconnected across the semiconductor device such that the semiconductor device is connected as one of at least four circuit elements of the bridge circuit. At step 904, the changes are induced in the semiconductor, and at step 906, a balance condition of the bridge circuit is monitored.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of measuring laser induced phenomena changes of at least one of a resistance, a capacitance and an inductance in a semiconductor device, the method comprising:
   interconnecting an electrical bridge circuit across the semiconductor device, the semiconductor device being connected as one of at least four circuit elements of the bridge circuit;
   inducing the changes in the semiconductor device; and
   monitoring a balance condition of the bridge circuit.

2. The method as claimed in claim 1, wherein the bridge circuit is initially balanced prior to inducing the changes in the semiconductor device.

3. The method as claimed in claim 1, wherein the other circuit elements of the bridge circuit each comprise a switch matrix of interconnected components, and the method further comprises setting the other circuit elements to at least one of a selected resistance value, a selected capacitance value, and a selected inductance value.

4. The method as claimed in claim 3, comprising setting the circuit elements to the selected values incrementally.

5. The method as claimed in claim 3, wherein the other circuit elements each comprise a relay block.

6. The method as claimed in claim 3, wherein the selected values are substantially equal to corresponding values measured across the semiconductor device without the laser induced phenomena.

7. The method as claimed in claim 6, wherein the corresponding values are measured with the bridge circuit in a state wherein one or more circuit elements connected in series with the semiconductor device are switched to short circuit, and the other circuit elements are switched to open circuit.

8. The method as claimed in claim 1, wherein a voltage applied across the bridge circuit is selected such that an operating voltage of the semiconductor device is applied to the semiconductor device.

9. The method as claimed in claim 1, wherein the monitoring of the balance condition of the bridge circuit comprises an A/D conversion.

10. The method as claimed in claim 1, further comprising moving a laser beam across a surface of the semiconductor device.

11. The method as claimed in claim 10, wherein the monitoring of the balancing condition of the bridge circuit is coupled to the moving of the laser beam for generating map of the laser induced changes with reference to the surface of the semiconductor device.

12. The method as claimed in claim 1, further comprising utilising a pulsed laser beam for inducing the changes.

* * * * *